United States Patent [19]

Nakayama et al.

[11] Patent Number: 5,409,538
[45] Date of Patent: Apr. 25, 1995

[54] CONTROLLING METHOD OF FORMING THIN FILM, SYSTEM FOR SAID CONTROLLING METHOD, EXPOSURE METHOD AND SYSTEM FOR SAID EXPOSURE METHOD

[75] Inventors: Yasuhiko Nakayama; Masataka Shiba, both of Yokohama; Susumu Komoriya, Tokorozawa, all of Japan

[73] Assignee: Hitachi, Ltd., Tokyo, Japan

[21] Appl. No.: 77,896

[22] Filed: Jun. 16, 1993

Related U.S. Application Data

[63] Continuation of Ser. No. 594,351, Oct. 9, 1990, abandoned.

[30] Foreign Application Priority Data

Apr. 13, 1990 [JP] Japan .................................. 2-96443

[51] Int. Cl.$^6$ ................................................. G03F 7/00
[52] U.S. Cl. .................................. 118/688; 118/712; 250/205; 356/381
[58] Field of Search .............. 118/708, 712, 688, 663, 118/665, 690; 356/357, 433, 448, 338, 341, 381; 353/101, 122, 88; 355/68, 71; 250/492.1, 492.2, 205; 255/48

[56] References Cited

U.S. PATENT DOCUMENTS

| | | | |
|---|---|---|---|
| 4,308,586 | 12/1981 | Coates | 364/525 |
| 4,500,615 | 2/1985 | Iwai | 430/30 |
| 4,690,528 | 9/1987 | Tanimoto et al. | 353/101 |
| 4,780,747 | 10/1988 | Suzuki et al. | 355/68 |
| 5,250,116 | 10/1993 | Tanimoto | 118/712 |

FOREIGN PATENT DOCUMENTS

| | | | |
|---|---|---|---|
| 63-31116 | 2/1988 | Japan . | |
| 63-148633 | 6/1988 | Japan | 118/708 |
| 63-198329 | 8/1988 | Japan | 118/688 |

OTHER PUBLICATIONS

"Patent Abstracts of Japan", vol. 9, No. 126 (E-318) (1849) 31 May, 1985; & JP-A-60 012 732 (Hitachi Seisakusho K.K.) 23 Jan. 1985.

"Patent Abstracts of Japan", vol. 9, No. 296 (P-407) 22 Nov. 1985; & JP-A-60 133 549 (Toshiba K.K.) 16 Jul. 1985.

*Primary Examiner*—Thi Dang
*Attorney, Agent, or Firm*—Fay, Shapre, Beall, Fagan, Minnich & McKee

[57] ABSTRACT

A method for irradiating a substrate such as a semiconductor substrate, coated with a photoresist, with light to measure variations in optical properties, such as reflectivity, refractive index, transmittance, polarization, spectral transmittance, for determining an optimum photoresist coating condition, an optimum photoresist baking condition, an optimum developing condition or an optimum exposure energy quantity, and forming a photoresist pattern according to the optimum condition. A system for the exposure method, a controlling method of forming a photoresist film by use of the exposure method, and a system for the controlling method, are useful for stabilization of the formation or treatment of the photoresist film, and ensure less variations in the pattern size. Furthermore, even in the case of a thin film other than a photoresist film, the formation or treatment of the thin film can be stabilized by measuring the optical property before and during or after the formation of the thin film and using the measurement results to control the condition for forming the thin film, the etching condition or the coating condition.

26 Claims, 12 Drawing Sheets

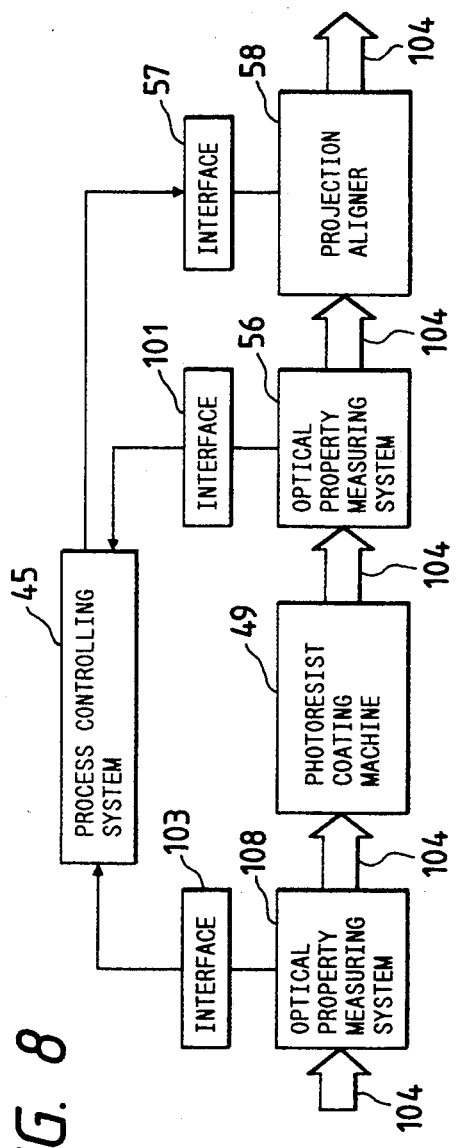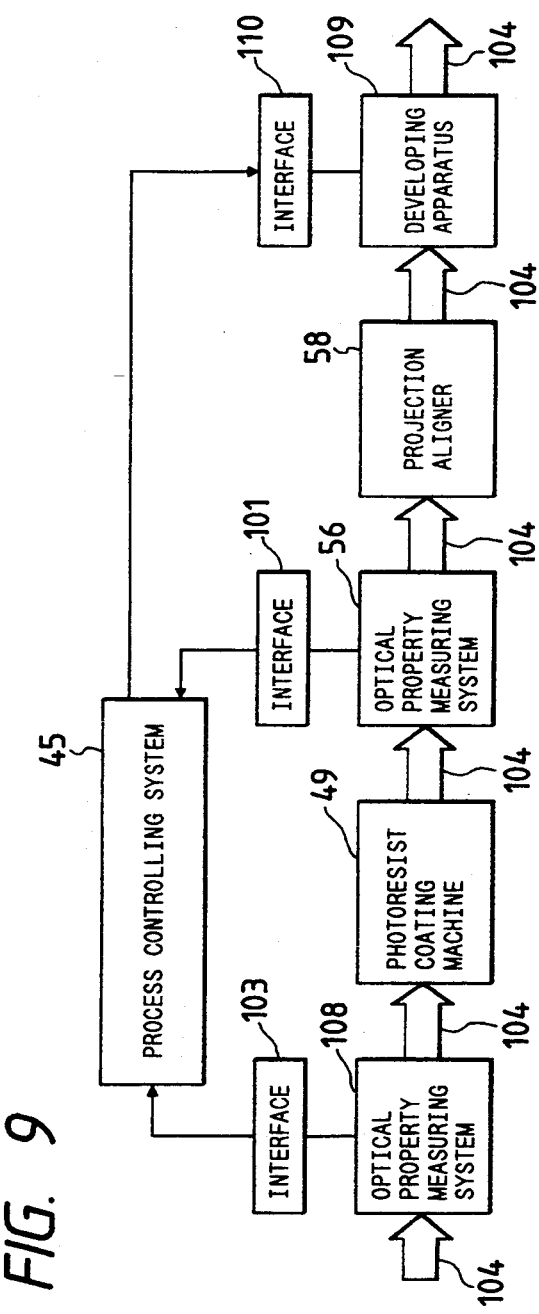

CONTROLLING METHOD OF FORMING THIN FILM, SYSTEM FOR SAID CONTROLLING METHOD, EXPOSURE METHOD AND SYSTEM FOR SAID EXPOSURE METHOD

This is a continuation of application Ser. No. 594,351, filed on Oct. 9, 1990, now abandoned.

BACKGROUND OF THE INVENTION

The present invention relates to the production of a semiconductor device or the like, and more particularly to a controlling method for forming a thin film suitable for stabilization of formation or treatment of a thin film of a semiconductor, a system for controlling the method, an exposure method and a system for the exposure method.

With the progress of high integration of semiconductor devices, pattern size has become finer, the device structure has become three-dimensional, and the manufacturing processes of semiconductor devices have become more complicated. It is therefore necessary to pay more attention than before to the stabilization of production process conditions in the manufacturing steps of semiconductor devices.

For instance, in projecting a pattern drawn on a reticle onto a wafer by a projection aligner, exposing light of a single wavelength in a comparatively narrow wavelength bandwidth is used. Therefore, as shown in FIG. 2a, the exposure light 71 undergoes multiple reflection in a photoresist film 72 or in a light-transmitting undercoat forming film 74. As a result, mutual interference of light occurs and the intensity of light varies in the depth direction inside the photoresist film 72. Accordingly, the exposure energy is varied in the depth direction and, upon development, the cross section of the photoresist film appears rugged, as shown in FIG. 2b. When the process conditions in various manufacturing apparatuses are varied, the thickness of photoresist film t or the formed condition of the light-transmitting undercoat 74 is varied. Consequently, upon exposing a photoresist under the same exposure energy, the width W of the photoresist in contact with the uppermost layer of the undercoat 73 is varied under the effect of stationary waves, resulting in varied pattern size. In order to stabilize the pattern size W, an optimum exposure energy according to the variation in the thickness of photoresist film t and the formed condition of the undercoat 74 should be set.

When the optical property or thickness of the photoresist film is varied due to variations in the photoresist coating or baking conditions in a photoresist coating machine, the pattern size varies even if the formed condition of the undercoat on the wafer or exposure and developing conditions are the same. It is therefore necessary, even in the photoresist coating machine, to keep monitoring the variation in coating and baking conditions, the major causes of variations in the thickness and optical properties of the photoresist film.

In thin film forming and treating steps such as the film forming step and etching step before or after the exposure step, as shown in FIG. 4, due to the increase in the diameter of the wafer formed and treated and the decrease in the thickness of film, the thickness and optical properties of the thin film formed and treated are varied with slight variations in the production process conditions. In a thin film forming and treating apparatus, therefore, it is necessary to constantly monitor the thickness and optical properties of the thin film being formed or treated, and to control the process conditions so as to keep constant the thickness and optical properties of the thin film.

A preliminary operation method of maintaining a constant pattern size in, for example, an exposure step in the presence of variations been performed in which exposure and development of one or several sheets of wafer are conducted on a trial basis. The pattern size is measured by a measuring instrument to judge the acceptability of exposure energy. The judgment is fed back to the opening and closing times for shutters in an optical system for illumination, or the like.

In the manufacture of small volumes of many types of products such as ASIC (Application Specific Integrated Circuit), however, the preliminary operation is required every time the type of product is changed. The requirement has increased the number of working steps and has been the major cause of lowering the operating efficiency of an exposure apparatus. With the trend towards higher integration, the method of correcting variations in the process conditions by such preliminary operations is unable to give sufficient accuracy.

In order to eliminate the preliminary operations, a method has been devised, as disclosed in Japanese Patent Application Laid-Open (KOKAI) No. 63-31116 (1988). In the method, assuming that the relationship between the thickness of a photoresist film and pattern size and the relationship between exposure energy and pattern size are known, the thickness of a photoresist film on a wafer to be exposed is measured by a photoresist film thickness measuring apparatus incorporated in a reduction projection aligner. The measurement result is fed back to the exposure energy so as to reduce variations in the pattern size and to stabilize the pattern size.

In a thin film-forming and treating step, also, a method has been used in which the thickness of a photoresist film is measured for the preceding wafer by an apparatus for forming and treating a thin film. The process conditions for fabrication of the intended product is set based on the film thickness thus measured.

Of the prior arts mentioned above, the stabilization of pattern size has been carried out by measuring variations of the thickness of a photoresist film formed by coating, determining an optimum exposure energy based on the measurement results, and controlling the pattern size. With the recent increasingly higher integration of semiconductor devices, however, it has become impossible to ignore the effects of variations in the manufacturing process conditions, such as variations of the formed state of an undercoat due to variations in forming and treating conditions in the thin film forming and treating step, variations of the optical properties of a photoresist film due to variations in coating and baking conditions in the photoresist coating step, etc.

Furthermore, in the thin film forming and treating step according to the prior art, the operation with the current film thickness measuring apparatus is affected directly by variations in the state of an undercoat formed in the precedent step resulting in errors in the measured values of the film thickness. It is therefore difficult to set accurately the optimum process conditions based on the measurements of the film thickness.

SUMMARY OF THE INVENTION

It is an object of the present invention to provide a controlling method of forming a thin film, and a system for the method, which reduces variations in the settings of process conditions for the above-mentioned manufacturing processes and to ensure stability in the formation and treatment of a thin film.

It is another object of the present invention to provide an exposure method and system therefor to constantly a pattern size irrespective of variations in the process conditions.

The above objects can be attained by measuring an optical property of an undercoat prior to formation and treatment of a desired thin film, and correcting the measurements of the optical property obtained during or after the formation or treatment of the thin film, thereby controlling the process conditions accurately.

For instance, in an exposure step for projecting a pattern onto a photoresist, which is a light-transmitting thin film with a complex refraction index (the optical property of interest here) varied during formation and treatment of the thin film, an optimum exposure energy for obtaining a required pattern size is obtainable by measuring the optical property of an undercoat before application of the photoresist, measuring the variation in the optical property due to exposure of a wafer coated with the photoresist, and determining the variation in the optical property of the photoresist.

As exposure of a photoresist proceeds, the optical properties of the photoresist, such as absorption coefficient ($\kappa$) and refractive index (n), are varied as shown in FIGS. 5a and 5b. The manner by which the optical properties are varied with time depend on, for instance, variations in the reflectivity of the undercoat arising from variations in process conditions of the manufacturing apparatus in the step preceding the exposure step. However, the optical properties, such as absorption coefficient and refractive index, of the photoresist upon completion of the projection of the pattern on the wafer are substantially constant. As seen in FIGS. 5a and 5b, though the optimum time to finish exposure varies from $T_1$ through $T_2$ to $T_3$ under the influence of variations in the process conditions, the absorption coefficient $\kappa_1$ and refractive index $n_1$ upon completion of the exposure are substantially constant. In view of this fact, the variations of the optical properties, such as absorption coefficient ($\kappa$) and refractive index (n), of the photoresist with time during exposure can be determined by measuring the variations in these optical properties during provisional exposure conducted over part of a photoresist-coated wafer prior to the pattern projecting step.

The optical properties of the photoresist cannot be measured directly. The values of these properties are obtained by measuring the optical properties of the undercoat before application of the photoresist. Based on the measurement results, the complex index of refraction N ($=n-i\cdot\kappa$) of the photoresist derived from the variation in the reflectivity R of the wafer upon coating with the photoresist is corrected, and the corrected complex index of refraction N into the absorption coefficient ($\kappa$) and the refractive index (n) is reduced. Based on the optical property values thus obtained, art exposure energy T, photoresist coating conditions (the rotational frequency of a spinner for applying the photoresist, the temperature, humidity or gas pressure in the spinner, or the like) or photoresist baking conditions (baking temperature or baking time for baking the applied photoresist) necessary for the photoresist on the wafer to fulfill the pattern size accuracy requirements are calculated. The results of the calculation are fed back to an illumination system in a projection aligner used for actual pattern projection, a photoresist coating machine, or the like, whereby stabilization of control of the pattern size is achievable.

Similarly, a method may be adopted in which an exposure energy T, photoresist coating conditions or photoresist baking conditions necessary for a photoresist formed on a wafer to fulfill the pattern size accuracy requirements are determined by measuring both the spectral transmittance of an undercoat before coating with the photoresist and the variation with time of the spectral transmittance due to exposure of the wafer after coating with the photoresist, and calculating the variation of the spectral transmittance of the photoresist with time based on the measurement results.

Furthermore, in a step of forming a thin film having a light-transmitting property, for instance, an optimum film forming condition for obtaining the required formed film thickness is achievable through determining the manner in which an optical property of the film being formed varies, based on both the optical properties of the undercoat before film formation and variations in the optical properties of the wafer during the film formation.

As a film is formed on a wafer, the reflectivity Rd of the wafer varies as shown in FIG. 6. The manner by which the reflectivity varies is influenced by variations in the process conditions of an apparatus used in the step precedent to the film forming step. When the film forming time is controlled based on the variation in the reflectivity of the wafer, therefore, the film forming time varies in the range from $T_0$ to $T_1$. That is, under varying process conditions, the reflectivity Rd varies in the range from curve $R_0$ to curve $R_0'$ and, therefore, control of the film forming time to a time point when a certain reflectivity is obtained will lead to variation in the film forming time from $T_0$ to $T_1$, resulting in the corresponding variation in the thickness of the film formed. When the optical property of the undercoat before film formation (the optical property is a cause of variations in the process conditions) is measured, the relationship between the reflectivity Rd of the wafer and the thickness d of the film formed is as shown in FIG. 7; therefore, when the variation in the reflectivity of the wafer during film formation is reduced to the variation in the thickness of the film being formed, by use of the reflectivity of the undercoat measured before the film formation, the relationship between the reflectivity of the wafer and the film forming time shown in FIG. 6 can be reduced to the relationship between the thickness of the film being formed and the film forming time. Thus, it is possible by use of the relationships to determine, on a real-time basis, the thickness of the film being formed. Accordingly, by converting the film forming rate and the formed film thickness thus obtained into process condition variables it is possible to stabilize the operation of the apparatus. The upper and lower curves in FIG. 7 correspond to curve $R_0$ and curve $R_0'$ in FIG. 6, respectively.

As described above, it is possible, by preliminarily measuring an optical property before formation and treatment of a desired thin film and correcting the optical property values measured during or after the formation or treatment of the thin film, to control accurately and stabilize the process conditions.

The optical properties of a thin film in a thin film forming and treating step will now be explained below, taking reflectivity as an example.

Determination of the optical properties of the thin film in the thin film forming and treating step is performed by measuring the reflectivity R of the wafer, before, during and after the formation or treatment of the thin film on the wafer at the same position. Based on parameters which are given beforehand, such as the complex index of refraction n' of the uppermost layer of an undercoat, etc., variations in the optical properties of the thin film being formed or treated (the thickness d, absorption coefficient κ, or refractive index n of the thin film) are determined from the reflectivity R of the wafer using the measurement results of the reflectivity R' of the undercoat. Variations in the process conditions can be determined accurately therefrom.

According to Hiroshi Kubota, *Hadoh-Kohgaku* (*Wave Optics*), Iwanami Shoten Publishers, Tokyo, the reflectivity R of a light-transmitting thin film is given by $$R = f(N, n', R', I_2, d) \quad (1)$$

where N: complex index of refraction of thin film being formed and treated $$N = n - i \cdot \kappa$$

n: refractive index of thin film being formed and treated
κ: absorption coefficient of thin film being formed and treated
n': complex index of refraction of uppermost layer of undercoat beneath thin film being formed and treated
R': reflectivity of undercoat beneath thin film being formed and treated
$I_2$: irradiation illumination
d: thickness of thin film being formed and treated Therefore, if n' and $I_2$ are measured beforehand, variations with time of the optical properties of the thin film being formed and treated can be determined accurately, by measuring R' before the formation or treatment of the thin film and correcting the measurements of variation in reflectivity R with time.

For instance, because the thickness of a photoresist being irradiated with exposure light is not changed by the irradiation, preliminary measurement of n', $I_2$ and d in equation (1) and correction of measurements of variation in the reflectivity R make it possible to determine accurately the variation in the complex index of refraction N ($N = n' \cdot i \cdot \kappa$) of the photoresist with time, even if the reflectivity of the undercoat is varied due to variations in the process conditions. Therefore, if an exposure energy $E_1 = I_2$ (illuminance)$\times T_2$ (time) corresponding to such a complex index of refraction $N_1$ ($= n_1 - i \cdot \kappa_1$) of the photoresist as to give the required pattern size is determined, the exposure energy $E_1$ is the optimum exposure energy.

Besides, the optical properties such as absorption coefficient and refractive index, of the photoresist eventually converge at known, fixed values as shown in FIGS. 5a and 5b. Therefore, when the eventually converging reflectivity R is measured for variation in the thickness d of the photoresist film in this condition, based on the relationship represented by equation (1), the film thickness d can be calculated accurately from the reflectivity by use of the relationship shown in FIG. 11, without preliminary measurement as mentioned above regardless of variations in the reflectivity of the undercoat due to variations in the process conditions.

Meanwhile, the spectral transmittance of a photoresist, before and after exposure, is generally as shown in FIG. 12. The curvature varies as the reflectivity of the undercoat varies with the process conditions. Therefore, preliminary measurement of the spectral transmittance of the undercoat before coating with the photoresist and correction of the measurements of the spectral transmittance during the exposure give variation in the spectral transmittance of the photoresist with time. When the data on a standard pattern of the spectral transmittance to be obtained at the end of exposure is stored beforehand, then the data on a standard pattern of the spectral transmittance actually measured at the end of exposure is compared with the prestored data and the time required for the two kinds of data to agree with each other is measured, the optimum exposure energy E [I (illuminance)$\times$T (time)] can be determined accurately.

By feedback of the optimum exposure energy thus obtained to a shutter opening and closing circuit in an illumination system for exposing in a projection aligner, an accurate and stable control of pattern size in the projection of the pattern intended can be achieved even if the reflectivity of the undercoat is varied due to variations in the process conditions.

It is known that the thickness of a photoresist film, the initial absorption coefficient thereof and the like vary from wafer to wafer or from lot to lot due to the instability of process conditions. It is possible, however, to stabilize the photoresist coating step if correction of the measurements of variations in the optical properties is carried out through partial exposure of the photoresist at a location on a scribed line or the like of the wafer by the above-mentioned method and the corrected values are fed back to a spinning step or a baking step so as to yield a constant result. This procedure enables a further reduction of variations in the pattern size arising from variations in the process conditions.

On the other hand, where the thin film to be formed and treated is one which is formed and treated by a film forming apparatus, an etching apparatus or a thin film forming apparatus other than the photoresist coating machine, the complex index of refraction N ($= n - i \cdot \kappa$) of the thin film is varied during the formation or treatment. Therefore, it is possible to determine the variation with time of the thickness d of the thin film being formed and treated from equation (1) by preliminarily measuring n' $I_2$ and N, measuring the reflectivity R' of the wafer before the formation and treatment of the thin film, and correcting the measurements of variation of the reflectivity R with time during the formation and treatment of the thin film. Accordingly, a feedback control of the process conditions of the forming and treating apparatus such as to make constant the film thickness determined in the above-mentioned manner ensures stabilization of the forming and treating apparatus, even if the reflectivity of the wafer before the formation and treatment of the thin film is varied due to variations in the process conditions.

The optical property measuring method is applicable further to transmittance, polarization property, or the like. With the method it is also possible to determine the variations in the process conditions accurately through correction similar to the above-mentioned correction of reflectivity values. Moreover, it is possible to stabilize the forming and treating apparatus.

BRIEF DESCRIPTION OF THE DRAWINGS

FIG. 2b is a sectional view showing the shape of a photoresist film developed after .exposure shown in FIG. 2a;

FIG. 8 is a block diagram showing the general construction of a controlling system for forming a thin film according to another embodiment of the present invention;

FIG. 9 is a block diagram showing the general construction of a controlling system for forming a thin film according to a further embodiment of the present invention;

DESCRIPTION OF THE PREFERRED EMBODIMENTS

Some preferred embodiments of the present invention will now be explained while referring to the accompanying drawings.

EXAMPLE 1

Figure 1:
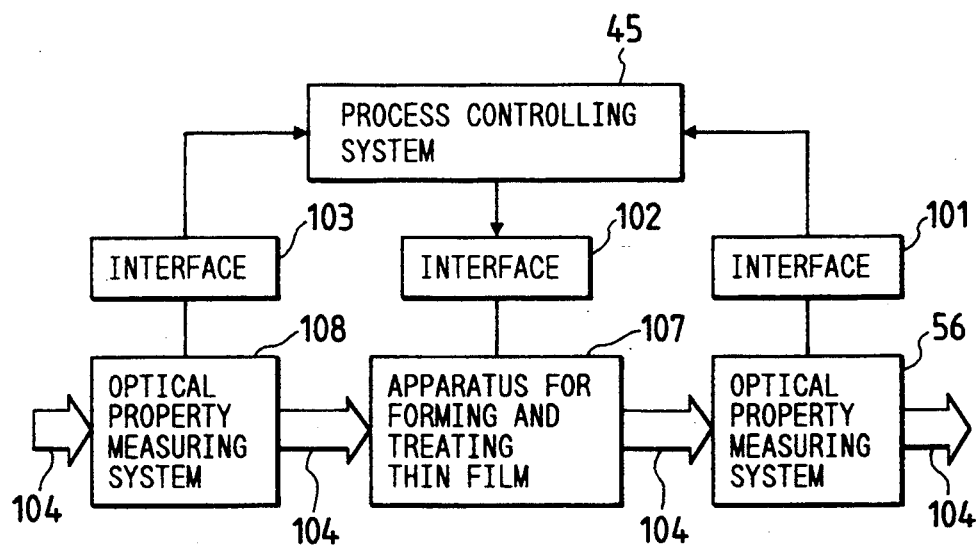
FIG. 1 is a block diagram showing the general construction of a controlling system for forming a thin film according to one embodiment of the present invention.
Figure 4:
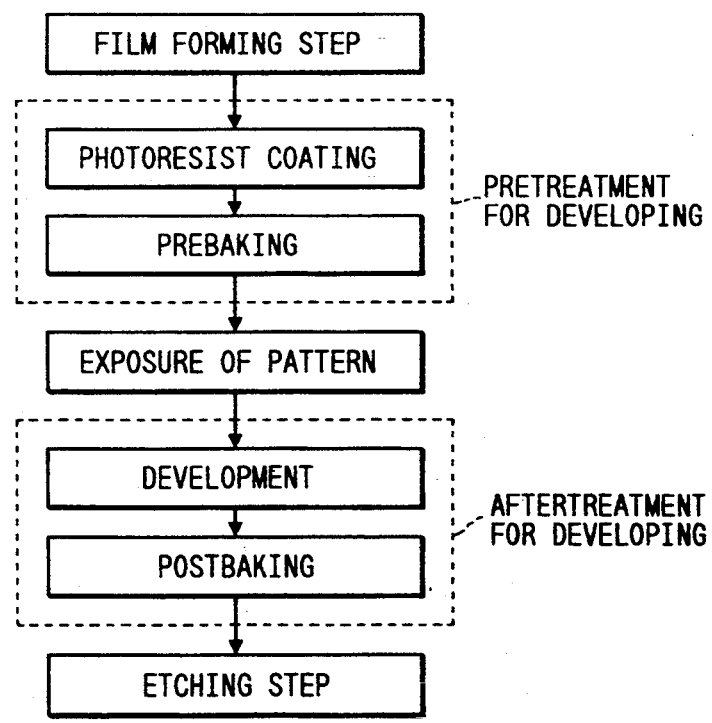
FIG. 4 is a flow sheet of a step of forming a thin film of a predetermined shape by photoetching.
Figure 2A:
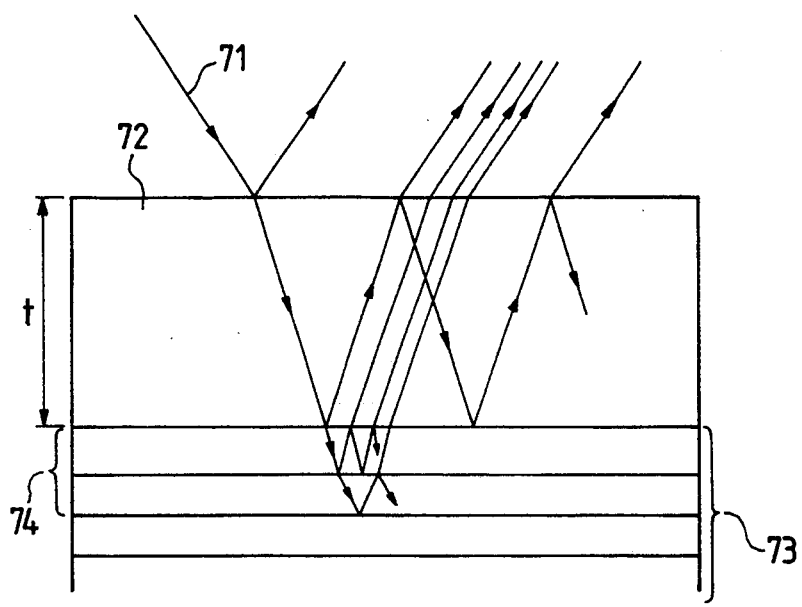
FIG. 2a is an illustration of the condition of multiple reflection in a photoresist and an undercoat forming film having a light transmitting property.
Figure 2B:
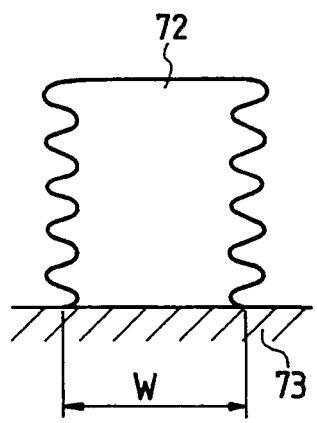
Figure 3:
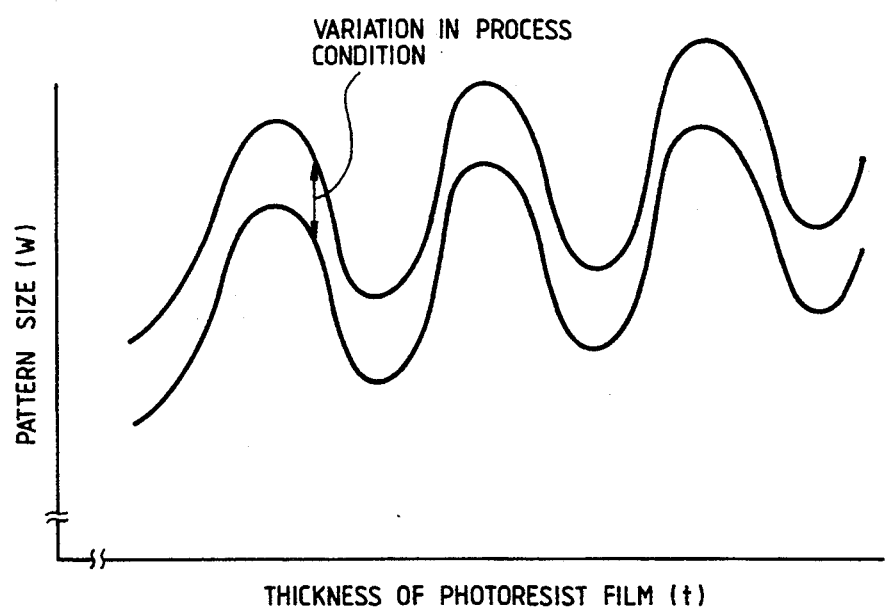
FIG. 3 is a graph showing the manner in which pattern size varies with the thickness of a photoresist film due to a stationary wave effect.

FIG. 1 is a block diagram showing a controlling system for forming a thin film according to a first embodiment of the present invention. In the figure, a wafer fed along a path for transferring wafers 104 to an optical property measuring system 108 is subjected to measurement of optical property before a thin film is formed and treated thereon. The result of the measurement is sent through an interface 103 to a process controlling system 45. The wafer to an apparatus for forming and treating a thin film 107. The wafer is then fed to an optical property measuring system 56. The optical property is measured at the same position as that measured by the optical property measuring system 108. The result of the measurement is sent through an interface 101 to the process controlling system 45, where the measurement result is corrected according to data sent from the optical property measuring system 108. From the data thus obtained through correction, variations in process conditions are calculated. The calculated variations in process conditions are fed back through an interface 102 to the apparatus for forming and treating a thin film 107, thereby stabilizing of the apparatus for forming and treating a thin film.

In this embodiment, the optical property measuring system 108 and the optical property measuring system 56 can be connected to a plurality of apparatuses for forming a thin film for which stabilization of thin film forming and treating conditions is contrived.

The apparatus for forming and treating a thin film 107 in this embodiment may be a photoresist coating machine. The variations in process conditions to be calculated by the process controlling system 45 may be variations in the photoresist coating and baking conditions. The apparatus for forming and treating a thin film 107 may be an etching apparatus. Furthermore, the apparatus for forming and treating a thin film in this embodiment may be a thin film coating apparatus which is not varied in optical property even when irradiated with light.

EXAMPLE 2

Referring to FIG. 8, there is shown an embodiment in which the apparatus for forming and treating a thin film is a photoresist coating machine 49 and the apparatus to be controlled is a projection aligner. Data obtained by an optical property measuring system 108 is used by a process controlling system 45 for correcting data obtained through measurement by an optical property measuring system 56. The optical property of only the photoresist is extracted from the corrected data, and an optimum exposure energy value for forming a required pattern is established based on the extracted optical property data. The exposure energy value is fed back through an interface 57 to a projection aligner 58. When a wafer of which the optical property has been measured by the optical property measuring systems 108 and 56 is fed into the projection aligner 58, exposure is carried out with the exposure energy value for the wafer, so as to stabilize the size of a pattern formed by the projection aligner 58.

EXAMPLE 3

FIG. 9 shows an embodiment in which the apparatus for forming and treating a thin film is a photoresist coating machine and the apparatus to be controlled is a developing apparatus. By using data obtained by an optical property measuring system 108, data obtained on measurement by an optical property measuring system 56 is corrected by a process controlling system 45. The optical property of the photoresist only is extracted from the corrected data, and an optimum developing condition for forming a required pattern is established according to the extracted data. The developing condition is fed back to the developing apparatus 109 through an interface 110. When a wafer of which the optical property has been measured by the optical property measuring systems 108 and 56 is fed into the developing apparatus 109, development is conducted under the developing condition established for that wafer, thereby stabilizing the size of a pattern formed by the developing apparatus 109.

EXAMPLE 4

Figure 10:
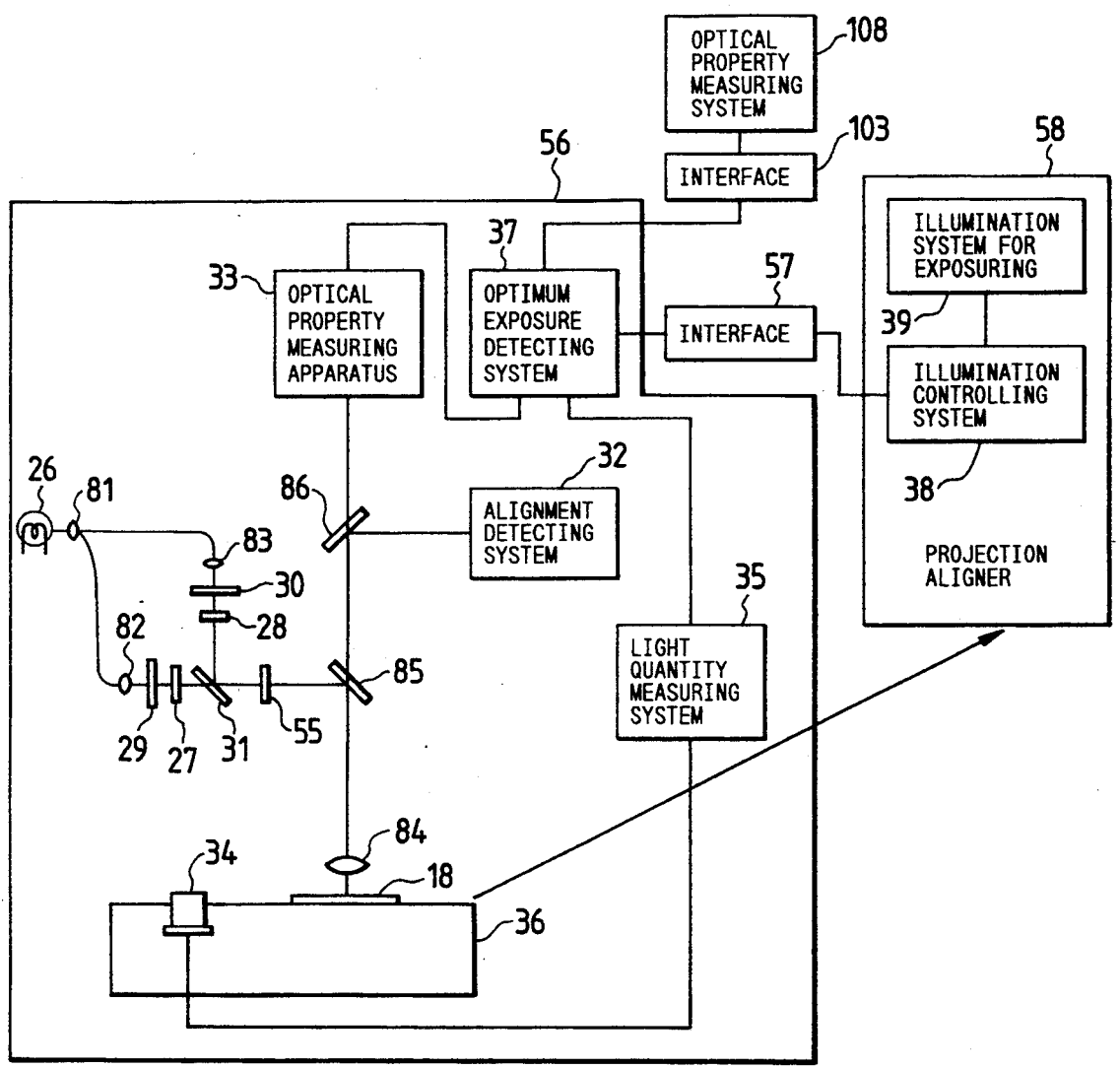
FIG. 10 is a schematic illustration of one embodiment of a practical form of an optical property measuring system which is usable for a controlling system for forming a thin film according to the present invention.

FIG. 10 is a schematic illustration of the optical property measuring system 56 in Example 1 and an interface 57. In the figure, illuminating light emitted from a light source 26 such as a mercury vapor lamp is guided by a lens 81 to an optical fiber or the like, and is branched into two beams of light. The beams of light are led by lenses 82 and 83 and pass through shutters 29 and 30. Interference filter 27 permits passage therethrough of the beam of light with an exposure wavelength. Sharp-cut filter 28 transmits light with a non-exposure wavelength. The beams of light are turned ON and OFF by switching the shutters 29 and 30. The two beams of light are led through a beamsplitter 31, by which the optical axes are combined. The combined beam of light is directed through a beamsplitter 85 to irradiate a wafer therewith. A lens 84 is an objective lens. A field stop 55 is provided for narrowing and limiting the region of irradiation of the wafer with the beam of light having an exposure wavelength. When the shutter 29 is closed and the shutter 30 opened, the wafer is irradiated with the beam of light with non-exposure wavelengths light is reflected back, transmitted through the beamsplitter 85, reflected by a beamsplitter 86 onto an alignment detecting system 37. By moving an X-Y stage 36 while under observation of the alignment detecting system (television camera) 32 it is possible to isolate a specified region on the wafer without exposing of the photoresist. When the stage is stationary and the shutter 29 is opened while the shutter 30 is closed, it is possible to irradiate the location isolated with exposure light.

On the other hand, data on the complex index of refraction n' of an undercoat, irradiation illuminance $I_0$ detected by an light quantity measuring system 35 (described later) and thickness of photoresist film d is preliminarily measured and inputted into an optimum exposure detecting system 37. The reflectivity R' of the undercoat is preliminarily determined by an optical property measuring system 108 and inputted into an optimum exposure detecting system 37. The optimum exposure detecting system 37 calculates the variation with time of the complex index of refraction N of the photoresist from the above-mentioned formula (1), based on the variation in the reflectivity R of the photoresist, which is a secondary optical property during exposure and measured by an optical property measuring system (photosensor) 33. An optimum exposure energy $E_1$ (=exposure time $T_2$×irradiation illuminance $I_2$) is obtainable based on the exposure time $T_2$ necessary for the complex index of refraction N of the photoresist to reach a desired value $N_1$ (=$n_1-i\cdot\kappa_1$) and the irradiation illuminance $I_2$ detected by the light quantity measuring system 35, described hereinbelow.

Figure 5A:
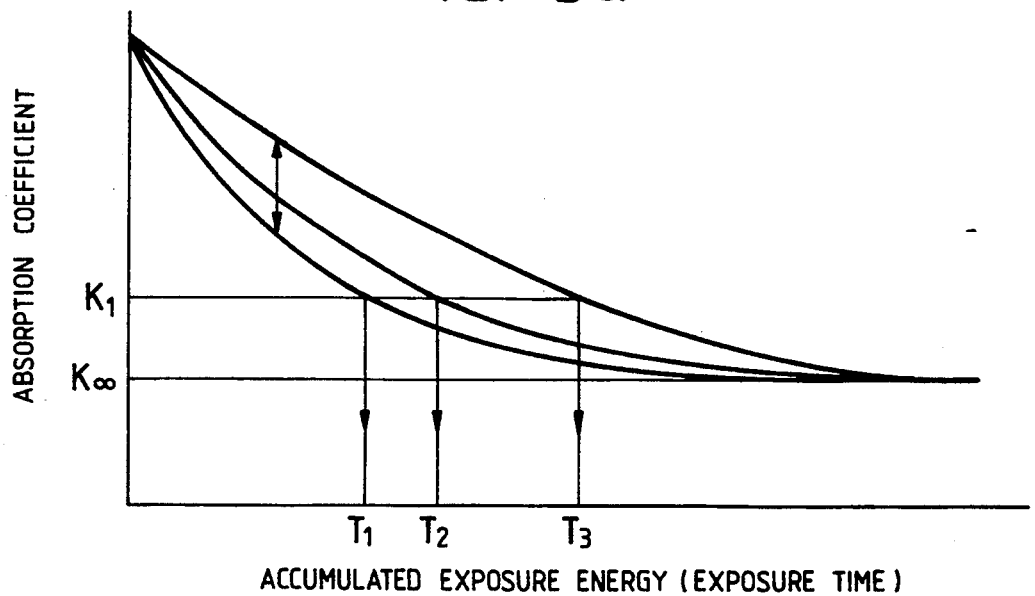
FIG. 5a is a graph showing the relationship between the absorption coefficient κ of a photoresist and exposure time, namely, accumulated exposure energy.
Figure 5B:
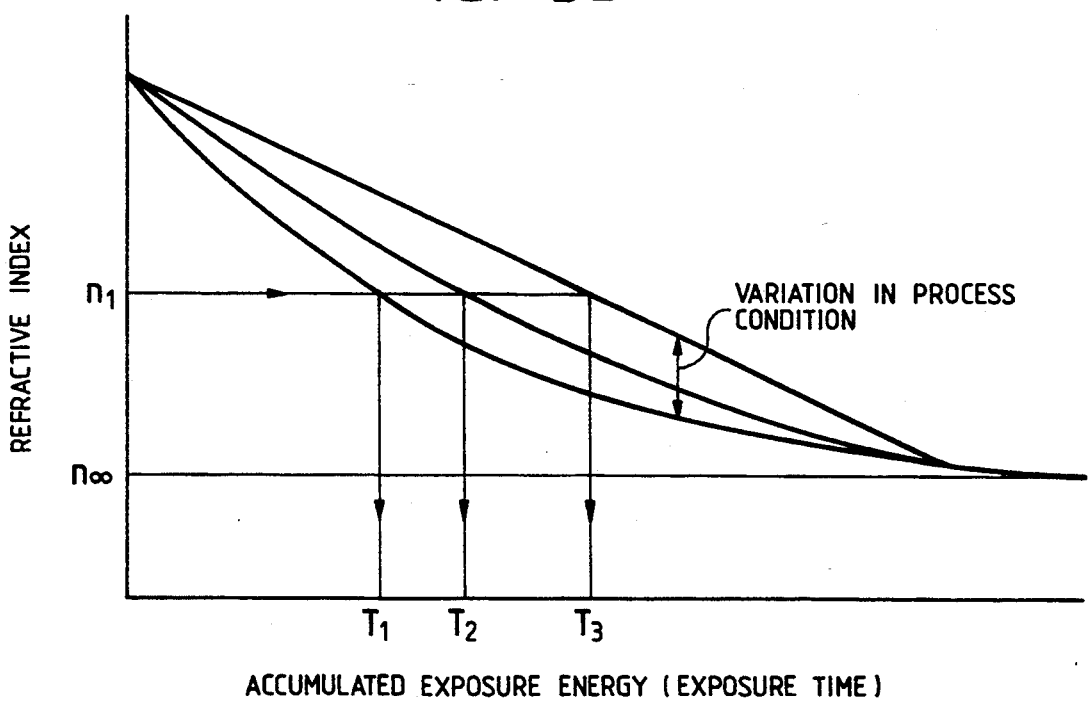
FIG. 5b is a graph showing the relationship between the refractive index n of the photoresist and exposure time, namely, accumulated exposure energy.
Figure 6:
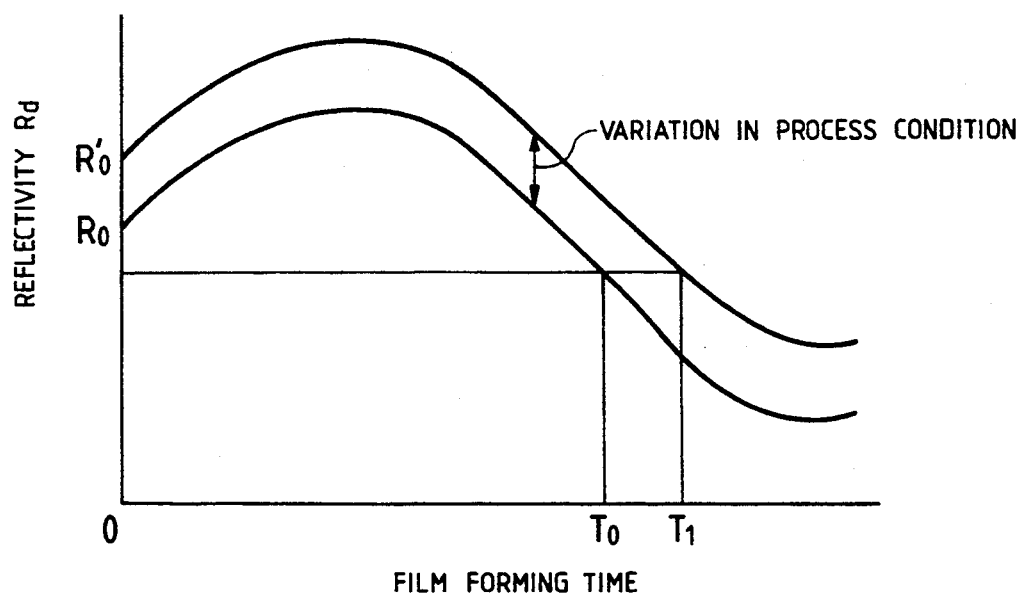
FIG. 6 is a graph showing the relationship between the reflectivity Rd of a wafer and time required for forming a film on the wafer.
Figure 7:
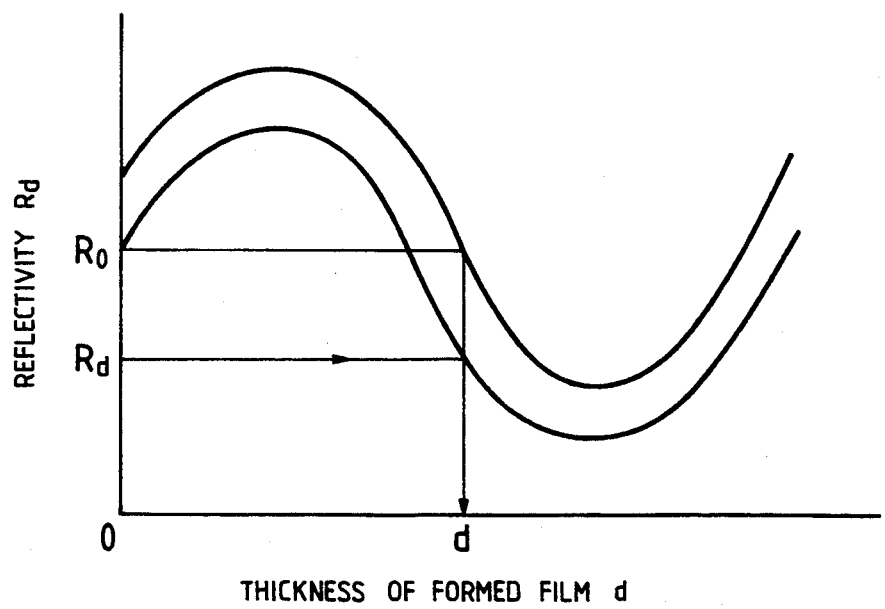
FIG. 7 is a graph showing the relationship between the reflectivity Rd of a wafer and the thickness of a film on the wafer.
Figure 11:
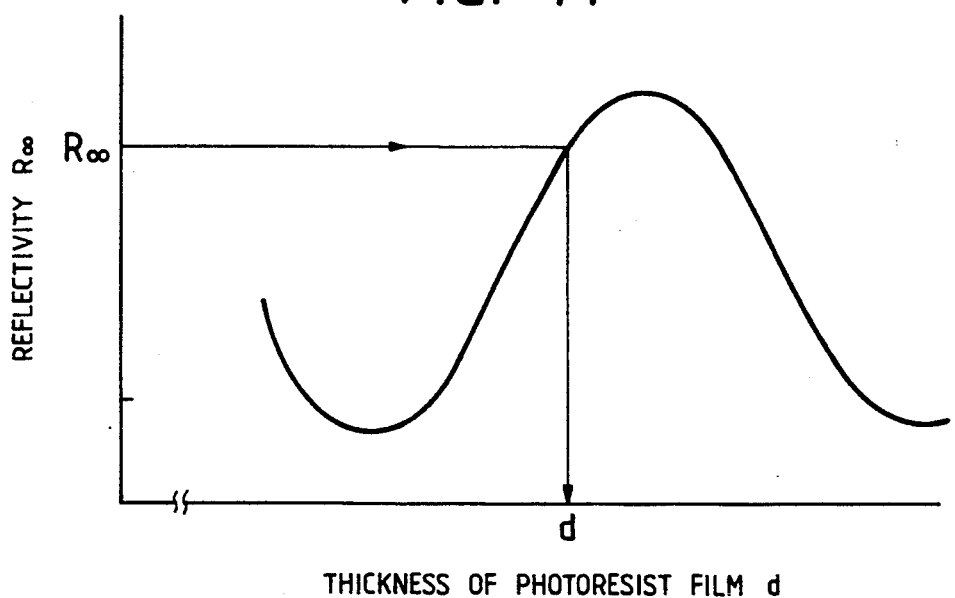
FIG. 11 is a graph showing the relationship between the reflectivity $R_\infty$ of a photoresist subjected to continuing exposure until the reflectivity converges at a fixed value and the thickness of the photoresist film.

The optical properties of the photoresist eventually converges at fixed values $\kappa_{28}$ and $n_\infty$, as shown in FIGS. 5a and 5b. On the basis of the relationship represented by the formula (1) (wherein $N_\infty = n_\infty - i\cdot\kappa_\infty$ has a known value), therefore, the variation in reflectivity $R_\infty$ with the thickness of photoresist film d in this condition is as shown in FIG. 11. Thus, by exposing a photoresist and measuring the reflectivity $R_\infty$ at the moment the optical property converges at a certain value, it is possible to determine the thickness of photoresist film d from the reflectivity according to the relationship shown in FIG. 11, without the above-mentioned preliminary measurement. It is accordingly possible to determine the thickness of photoresist film d from the variation in the reflectivity R of the photoresist, as mentioned above, without need for preliminary measurement of the thickness of photoresist film. The thickness of photoresist film d thus obtained can be used to calculate the variation with time of the complex index of refraction N of the photoresist, in an optimum exposure detecting system 37.

An illuminance detecting apparatus 34 is a photoelectric transducer for measuring the illuminance at the wafer position. When the illuminance detecting apparatus 34 is moved to an exposure position (the position at which to detect the variation in the reflectivity R of the photoresist) by use of the X-Y stage, the light quantity measuring system 35 is capable of measure the illuminance of the exposure light (irradiation illuminance) based on a signal obtained from the illuminance detecting apparatus 34. Then, the optimum exposure detecting system 37 calculates the variation with time of the complex index of refraction N of the photoresist from the data on the complex index of refraction n' of the undercoat, the reflectivity R' of the undercoat, the irradiation illuminance $I_2$, and the thickness of photoresist film d, and the variation in the reflectivity R of the photoresist, based on the relationship of the above-mentioned formula (1). The optimum exposure detecting system 37 determines the optimum exposure energy $E_1$ (=exposure time $T_2$×irradiation illuminance $I_2$) based on the exposure time $T_2$ necessary for the complex index of refraction N of the photoresist to reach a desired value $N_1$ (=$n_1-i\cdot\kappa_1$) and the irradiation illuminance $I_2$ detected by the illuminance detecting apparatus 34 light quantity measuring system 35. The optimum exposure energy $E_1$ is transferred as data to an illumination controlling system 38 in a projection aligner 58.

In operation, first, a wafer 18 coated with a photoresist is fed into the apparatus. Then, the shutter 29 is closed. The shutter 30 is opened to irradiate the wafer 18 with non-exposure light. A region on the wafer, for instance, a part of a scribed line is searched with an alignment detecting system (television camera) 32 while the wafer 18 is moved by the X-Y stage 36. At this position, an exposure region is limited by a field stop 55. The shutter 30 is closed. The shutter 29 is opened, and the wafer 18 is exposed to light with an exposure wavelength. The variation in the reflectivity R of the photoresist, which is the secondary optical property of the wafer during exposure, is measured by the optical property measuring system (photosensor) 33. The optimum exposure detecting system 37 calculates the variation with time of the complex index of refraction N of the photoresist from the data on the complex index of refraction n' of the undercoat previously measured, the reflectivity R' of the undercoat, the irradiation illuminance $I_2$, the thickness of photoresist film d, and the variation in the reflectivity R of the photoresist measured by the optical property measuring system (photosensor) 33, in accordance with the above-mentioned formula (1). Then, the optimum exposure time $T_2$ for complex index of refraction N of the photoresist to reach the desired value $N_1$ ($=n_1-i\cdot\kappa_1$), namely, for exposure of the wafer 18 is obtained. Next, the illuminance detecting apparatus 34 is moved to the exposure position by the X-Y 36. There the illuminance of the exposure light is obtained from the light quantity measuring system 35 through detection by the illuminance detecting apparatus 34. Thus, the optimum exposure detecting system 37 determines the optimum exposure energy $E_1$ (=exposure time $T_2 \times$ irradiation illuminance $I_2$) and transfers the optimum exposure energy $E_1$ to the projection aligner 58. When the wafer 18, for which the optimum exposure energy $E_1$ has been determined, is fed into the projection aligner 58, an exposure time $T_1$ according to the energy is established by the illumination controlling system 38 based on the exposure light illuminance $I_1$ detected by an exposure light illuminance detecting apparatus (not shown in FIG. 10, but denoted by 9 in FIG. 9) disposed in the projection aligner 58. The shutter in the illumination system for exposure 39 is then driven.

In this embodiment, the optical property measuring system 56 can be connected to a plurality of projection aligner to be fed with the wafers 18 for which the optimum exposure energy $E_1$ has been determined, through an interface 57.

EXAMPLE 5

Figure 12:
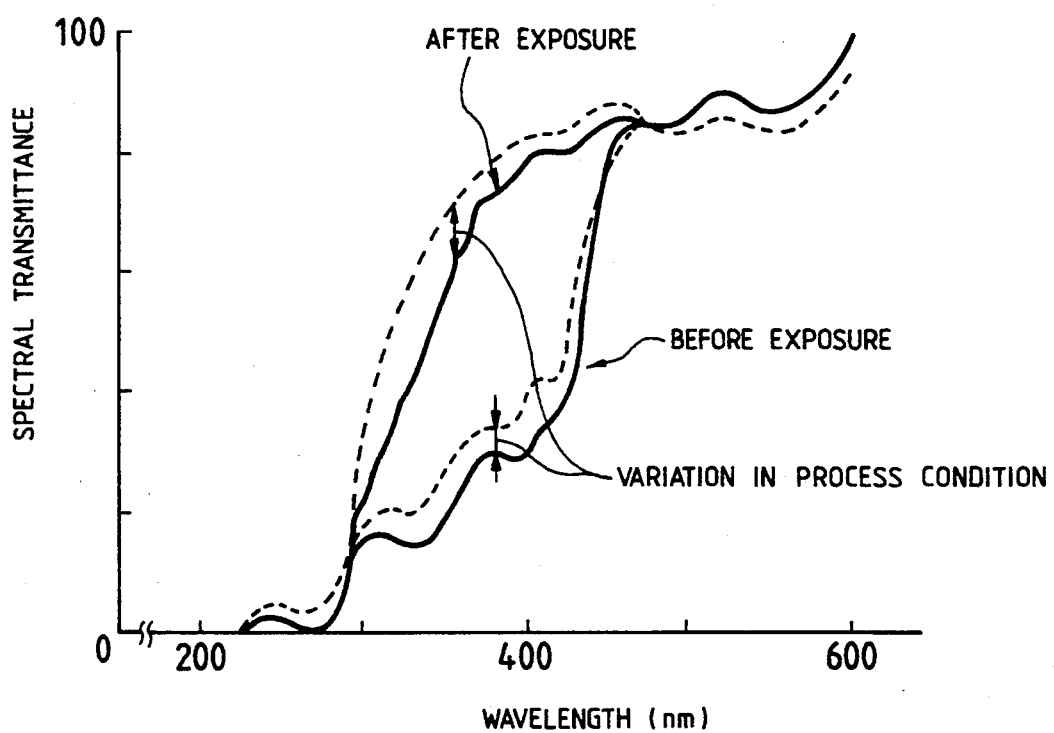
FIG. 12 is a graph showing the variation in spectral transmittance of a photoresist due to exposure.

When a spectroscope is used in place of the photosensor 33 in Example 3, spectral transmittance during the exposure process can be measured as a secondary optical property. In this case, first the shutter 29 is closed and the shutter 30 opened. The wafer 18 is irradiated with non-exposure light. A region on the wafer, for instance a part of a scribed line is searched with an alignment detecting system (television camera) 32 while the wafer 18 is moved by the X-Y stage 36. The exposure region is limited by a field stop 55. The shutter 30 is opened. The shutter 29 is also opened, and the wafer 18 is exposed to light containing a variety of wavelength components including exposure light. Then, spectral transmittance is detected through the spectroscope, the spectral transmittance being varied with time from a value before exposure to a value after the exposure, as shown in FIG. 12. Data of the spectral transmittance after exposure which shows a fixed value (reference spectral transmittance) is preliminarily inputted to the optimum exposure detecting system 37, which compares the variation with time of the spectral transmittance detected through the spectroscope with the data of the spectral transmittance after exposure (reference spectral transmittance), and determines an optimum exposure time $T_2$ for the varying spectral transmittance to accord with the reference spectral transmittance. Next, the illuminance detecting apparatus 34 is moved to the exposure position by the X-Y stage 36, and the illuminance of the exposue light is determined by the light quantity measuring system 35. Thus, the optimum exposure detecting system 37 determines the optimum exposure energy $E_1$ (=exposure time $T_2 \times$ irradiation illuminance $I_2$) based on the irradiation illuminance $I_2$ obtained from the light quantity measuring system 35 and the optimum exposure time $T_2$. The optimum exposure time $T_2$ is transferred to the illumination controlling system 38 in the projection aligner 58. Therefore, as in the above-mentioned example, when the optimum exposure energy $E_1$ has been obtained and is fed into the projection aligner 58, an exposure time $T_1$ according the energy is set by the illumination controlling system 38 based on the irradiation illuminance $I_1$ detected by an exposure light illuminance detecting apparatus (not shown in FIG. 10, but denoted by 9 in FIG. 16) disposed in the projection aligner 58, and the shutter in the illumination system for exposure 39 is driven.

EXAMPLE 6

Figure 13:
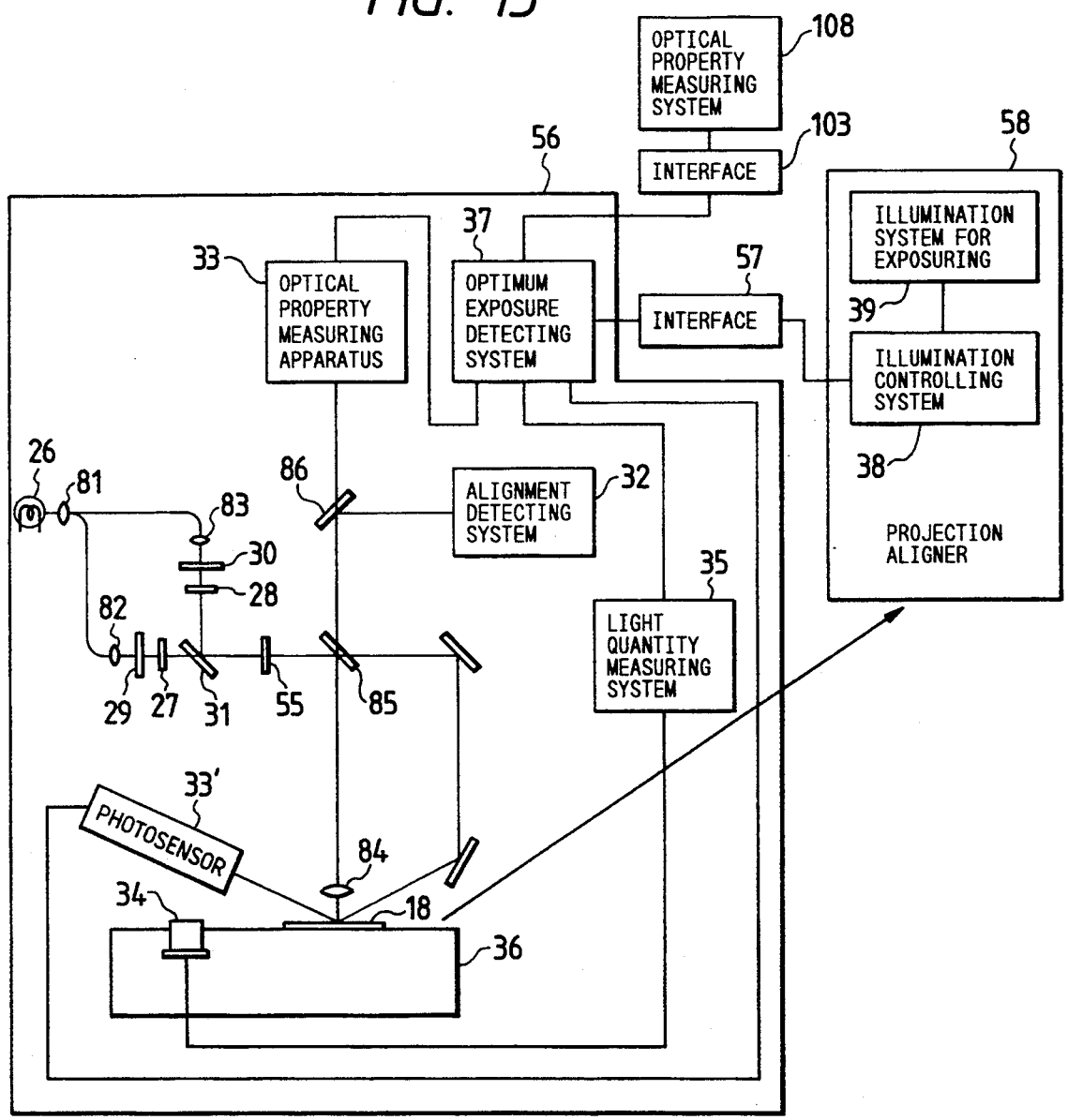
FIG. 13 is a schematic illustration of another embodiment of the optical property measuring system in the present invention.
Figure 14:
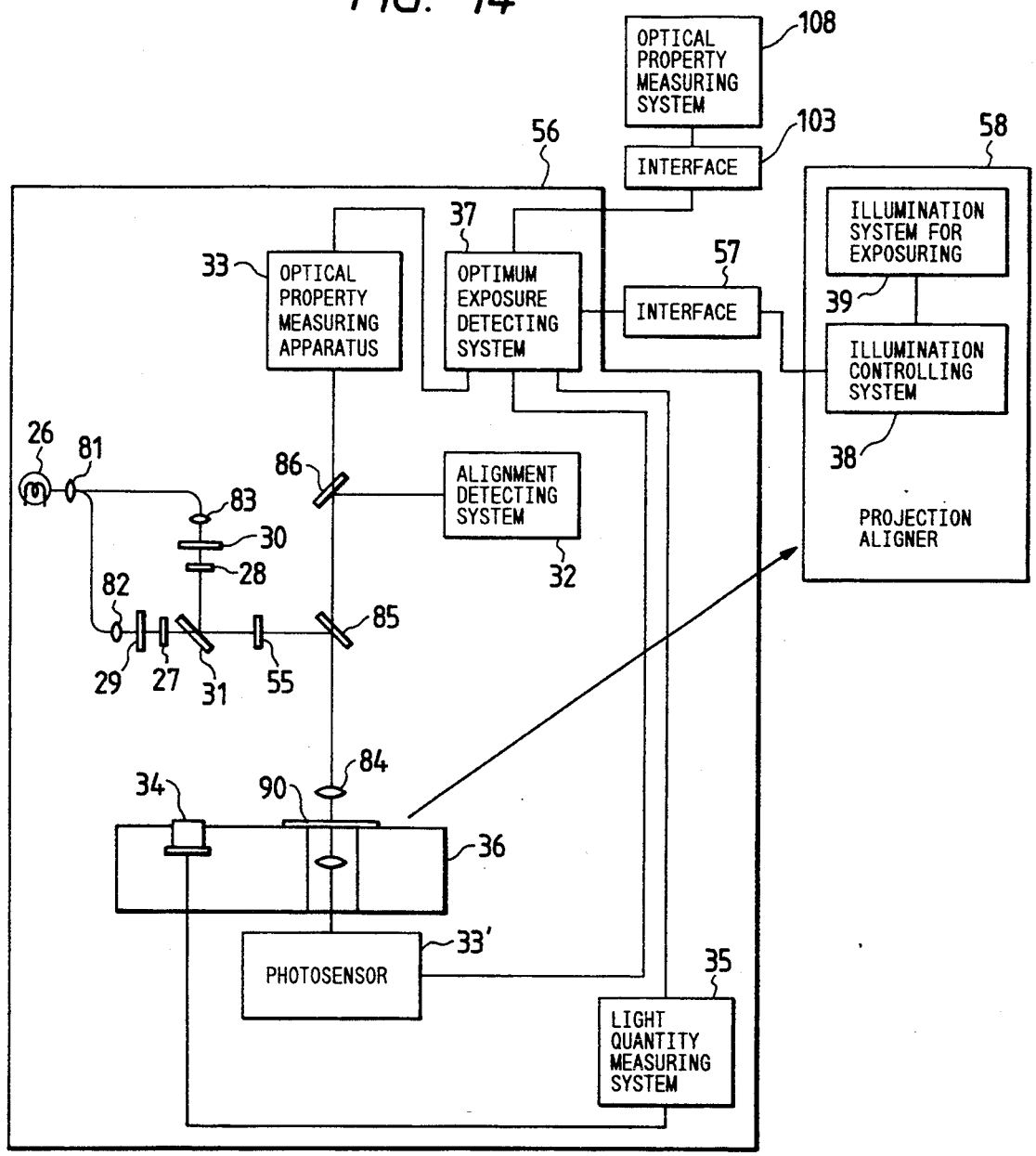
FIG. 14 is a schematic illustration of a further embodiment of the optical property measuring system in the present invention.

Modifications of Example 4 are shown in FIGS. 13 and 14, in which the basic construction is the same as in FIG. 10. In FIG. 13, light with non-exposure wavelengths used for measurement of the secondary optical property is projected obliquely and is detected obliquely by a photosensor 33'. By examining the polarization property, reflectivity or the like in this case, it is possible to measure the optical property under little influence of the undercoat on the measurement. In FIG. 14, the variations in the transmittance or spectral transmittance of the photoresist on the substrate due to exposure are capable of being measured by use of photosensors 33 and 33'. This process is effective in projecting a pattern onto a light-transmitting substance 90, such as a glass, of a TFT liquid crystal display or the like.

EXAMPLE 7

Figure 15:
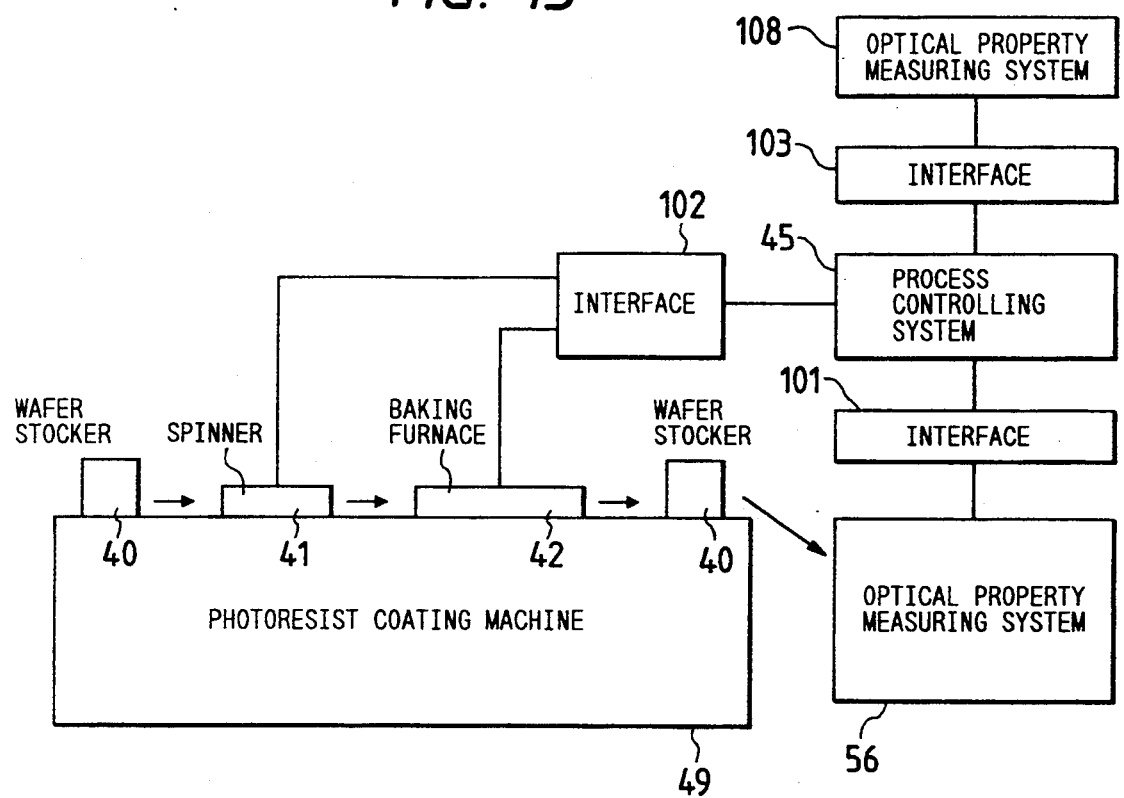
FIG. 15 is a schematic illustration of a controlling system for forming a thin film according to yet another embodiment of the present invention.

An embodiment in which, unlike the above embodiments, the apparatus controlled by an optical property measuring system 56 is a photoresist coating machine 49 is illustrated in FIG. 15. Data is sent from a process controlling system 45 to an interface 102 so that the variation in the optical property measured by the optical property measuring system 56 will be constant. The rotating frequency of a spinner 41, the temperature in a baking furnace 42 or baking time is controlled, whereby it is possible to stabilize a photoresist coating step. In this embodiment, the optical property measuring system 56 can be connected through an interface 57 to a plurality of photoresist coating machines of which the photoresist coating steps are to be stabilized. 40 is a wafer stocker.

It is also possible to control both the projection aligner 58 and the photoresist coating machine 49 by use of the optical property measuring system 56.

EXAMPLE 8

Figure 16:
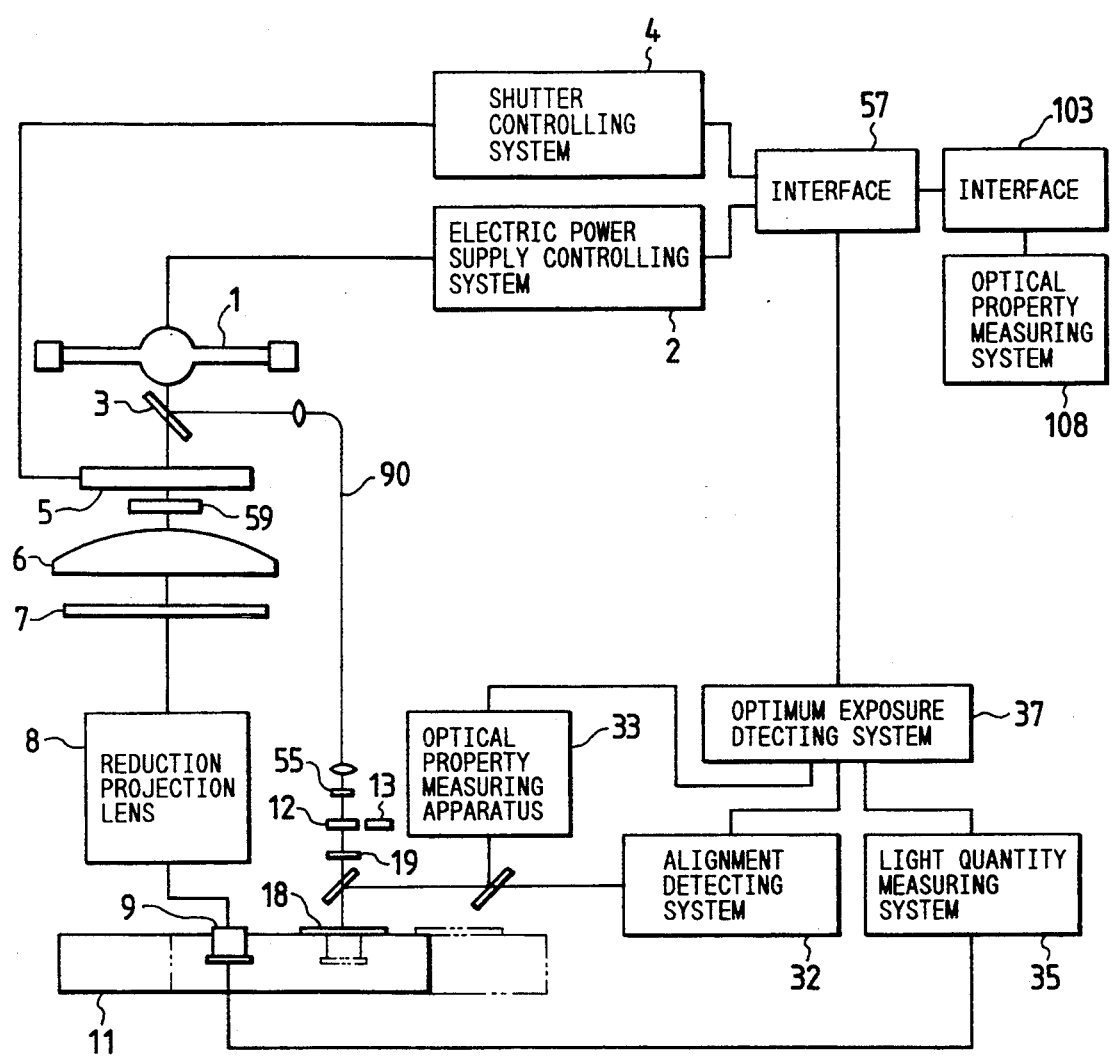
FIG. 16 is a schematic illustration of yet another embodiment of the optical property measuring system in the present invention.

FIG. 16 shows an embodiment in which a system for measuring the variation in optical property due to exposure of a wafer is mounted on a reduction projection aligner. In the figure, illuminating light from a mercury vapor lamp 1 is controlled to have a fixed illuminance by a power supply controlling system 2. On the other hand, the light from the mercury vapor lamp 1 is branched to an exposure system and a prealignment system by a beamsplitter 3. The light transmitted through the beamsplitter 3 is turned ON and OFF by controlling the opening and closing times of a shutter 5 by a shutter controlling system 4. In this system, only the exposure wavelength is extracted by an interference filter 59. The light transmitted through a condenser lens 6 is projected onto a reticle 7 provided with a required pattern. An image of the reticle is focused on a wafer 18 by a reduction projection lens 8. On the other hand, the other light reflected by the beamsplitter 3 is guided to the prealignment system through a field stop 55 by use of an optical fiber 90 or the like means. The light is led to either a sharp-cut filter 12 which transmits only the light with non-exposure wavelengths or to an interference filter 13 which transmits light with exposure wavelengths, by switching the filters 12 and 13. With the sharp-cut filter 12 selected, an alignment pattern on the wafer 18 can be detected by a prealignment detecting system 32, without exposing the pattern on the photoresist. A condensed beam of light with exposure wavelength can be set on a scribed line position on the wafer 18. Then, the filter is changed over from the sharp-cut filter 12 to the interference filter 13, whereby partial exposure of the wafer 18 can be performed, and the region of irradiation with the exposure light can be limited by a field stop 55. The variation with time of the reflectivity R of the photoresist during the exposure process is measured by a photosensor 33. The optimum exposure detecting system 37 calculates the variation with time of the complex index of refraction N of the photoresist from the complex index of refraction n' of the undercoat preliminarily measured and inputted, the thickness of photoresist film d, the reflectivity R' of the undercoat measured by the optical property measuring system 108, the reflectivity R of the photoresist measured by the photosensor 33 and the illuminance $I_2$ detected through the light quantity measuring system 35 supplied with an output from an illuminance detecting apparatus 9, based on the above-mentioned formula (1). An optimum exposure time $T_2$ for the complex index of refraction N of the photoresist to reach the desired value $N_1$ ($=n_1-i\cdot\kappa_1$) is determined, and an optimum exposure energy $E_1$ is determined based on the optimum exposure time $T_2$ and the illuminance $I_2$ detected through the light quantity measuring system 35. An exposure light illuminance $I_2$ at the time of actually projecting a circuit pattern in a reticle 7 through a reduction projection lens 8 onto the wafer 18 for which the optimum exposure energy $E_1$ has been determined is measured by an illuminance detecting apparatus 9. Then, an exposure illuminance or exposure time $T_1$ for obtaining the optimum exposure energy $E_1$ is determined based on an exposure light illuminance $I_1$. The thus obtained data is sent through an interface 57 to a power supply controlling system 2, which is an illuminance controlling system, and to control the opening and closing times of shutters by a shutter controlling system 4, in the same manner as in the above embodiments. The illuminance detecting apparatus 9 is a photoelectric transducer for measuring the illuminance at the image forming position, and the illuminance is measured by the light quantity measuring system 35. The illuminance detecting apparatus 9 is capable of measure the illuminance in the prealignment system, by moving an X-Y stage 11.

In this embodiment, it is unnecessary to measure the absolute illuminance. That is, the illuminance at the exposure position for projecting a pattern drawn on the reticle 7 onto the wafer 18 is detected by the illuminance detecting apparatus 9, which is then moved to the position of prealignment, and the illuminance of the light led to the prealignment system is determined. Then, the optimum exposure time $T_1$ at the exposure position for projecting the pattern drawn on the reticle 7 onto the wafer 18 is given by the following formula (2):

$$T_1 = (I_2/I_1) \times T_2 \quad (2)$$

where $I_1$ is the illuminance at the exposure position, $I_2$ is the illuminance at the prealignment position, and $T_2$ is the optimum exposure time for the light led to the prealignment system.

Thus, the optimum exposure time $T_1$ at the exposure position for projecting the pattern drawn on the reticle 7 onto the wafer 18 is obtainable from the optical property (reflectivity, spectral transmittance or the like) measured by the optical property measuring system (photosensor) 33 in the optimum exposure detecting system 37 and the illuminance measured by the illuminance detecting apparatus 9. In order to provide the exposure time thus determined, a controlling system 4 controls the illuminance of a mercury vapor lamp through power source control 2 in the illumination system and the opening and closing time of the shutter 5, whereby the pattern drawn on the reticle 7 is projected on the wafer 18 for the optimum exposure time. Thus, the pattern on the reticle 7 can be projected in conformity with the demanded pattern. In this embodiment, furthermore, the optimum exposure energy for the wafer immediately before exposure is determined, and there is only a short time from the determination of the optimum exposure energy to the actual exposure; therefore, there are few variations in the process conditions. In FIG. 16, 19 is a shutter.

EXAMPLE 9

Figure 17:
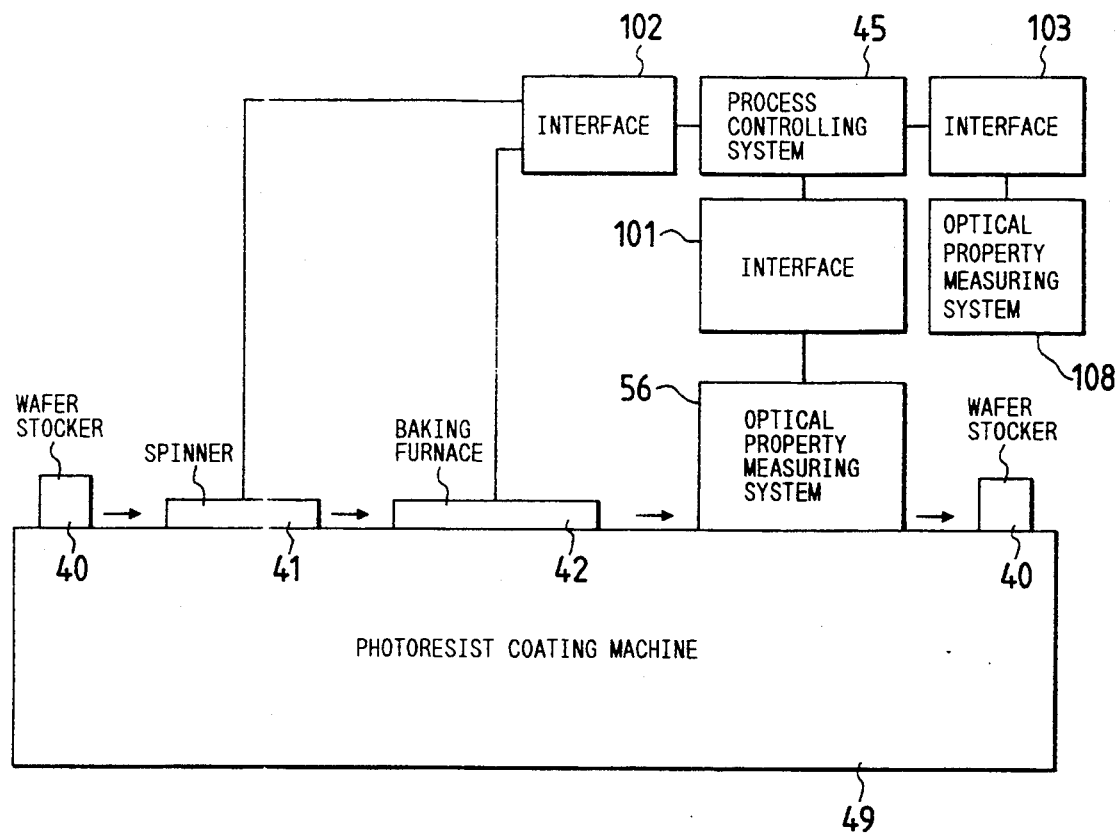
FIG. 17 is a block diagram showing the general construction of a controlling system for forming a thin film according to a still further embodiment of the present invention.

FIG. 17 shows an embodiment in which an optical property measuring system 56 is mounted on a photoresist coating machine 49. The optical property 10 of an undercoat of a wafer 18 is measured by an optical property measuring system 108, and the wafer 18 is fed from a wafer stocker 40 through a spinner 41 for applying a photoresist and through a baking furnace 42. Thereafter, variations in the reflectivity of the photoresist during an exposure process is measured by an optical property measuring system 56. The measurement result obtained from the optical property measuring system 56 and the measurement result obtained from the optical property measuring system 108 are inputted through interfaces 57 and 103 to a process controlling system 45, which controls variations in process conditions (e.g., coating weight at the spinner 41, baking conditions in the baking furnace 42, etc.).

According to this embodiment, variations in the thickness of photoresist film and variations in optical property, such as absorption coefficient, due to variations in the process conditions in the photoresist coating process can be reduced, and the photoresist coating process can be stabilized. Consequently, uniform exposure can be achieved for wafers stabilized in the photoresist coating process.

Though in the above embodiment the complex index of refraction N of the photoresist is calculated from the reflectivity R of the photoresist, it is apparent that direct measurement of the complex index of refraction N of the photoresist suffices.

EXAMPLE 10

Figure 18:
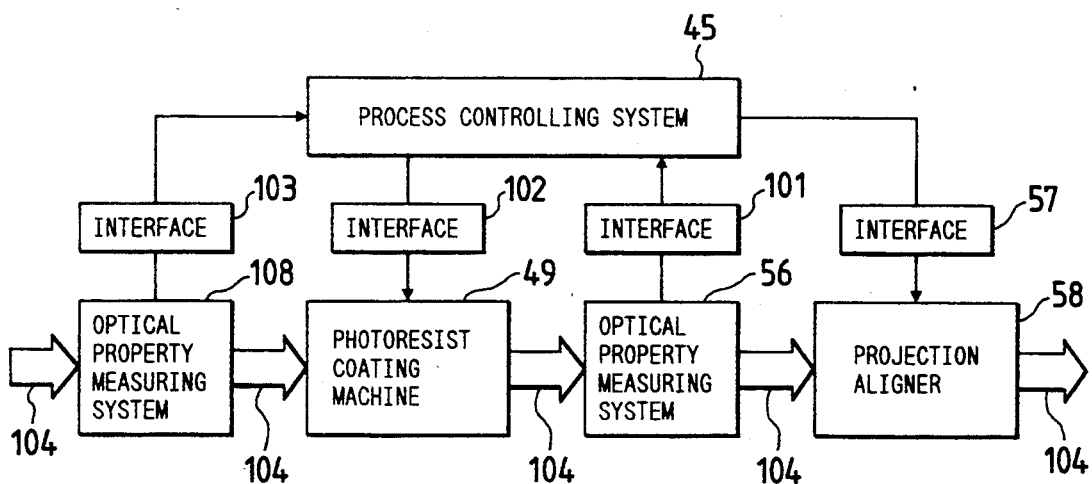
FIG. 18 is a block diagram showing the general construction of a controlling system for forming a thin film according to an additional embodiment of the present invention.

FIG. 18 is a schematic illustration of a system for stabilizing photoresist coating, baking and exposure processes, in which the apparatuses for which variations in process conditions are corrected are a photoresist coating machine 49 and a projection aligner 58. In the figure, the wafer is fed to an optical property measuring system 108, whereby the optical property of the wafer uncoated with the photoresist is measured. The resultant data is sent through an interface 103 to a process controlling system 45. After the measurement of the optical property, the wafer is fed along a path for transferring wafers 104 into the photoresist coating machine 49, whereby the photoresist is applied to the wafer and baked. The wafer coated with the photoresist is fed into an optical property measuring system 56, where the optical property of the wafer is measured by the optical property measuring system 108 before the wafer is coated with the photoresist. The thus obtained data is sent through an interface 101 to the process controlling system 45. The data sent from the optical property measuring system 108 is used to correct the data sent from the optical property measuring system 56. Based on the results of correction, the process controlling system 45 calculates the optimum exposure energy as a process variable for the exposure step and also calculate variations in process conditions for the photoresist coating step. When the wafer of which the optical property has been measured is fed along the path for transferring wafers 104 into the projection aligner 58, the optimum exposure energy corresponding to the wafer is inputted from the process controlling system 45 into the projection aligner 58 through an interface 57. Then, exposure is carried out for the optimum exposure time, whereby stabilization of pattern size is contrived. The variations in process conditions for the photoresist coating step obtained by the process controlling system 45 are fed back through an interface 102 to the photoresist coating machine 49, in order to stabilize the photoresist coating and baking conditions.

In this embodiment, the optical property measuring system 108 and the optical property measuring system 56 can be connected to a plurality of photoresist coating machines to stabilize the photoresist coating and baking conditions constituting the production process conditions, and to a plurality of projection aligners fed with wafers for which the optimum exposure energy has been determined.

When the exposure, coating and baking conditions are controlled once for a few wafers, an effect on automation of the conventional preliminary operation is obtained. Where process conditions in the same manufacturing apparatus vary on a wafer basis, it is possible to control the exposure, coating and baking conditions on wafer basis. Furthermore, where variations in the process conditions within a wafer are important, it is possible to control the exposure condition on a chip basis and to control the coating and baking conditions within the wafer.

In the above embodiment, the optical property measuring system 108 can be incorporated in the photoresist coating machine 49, and the optical property measuring system 56 can be incorporated in the photoresist coating machine 49 or the projection aligner 58. When the optical property measuring system 56 is incorporated in the projection aligner 58, the optimum exposure energy for a wafer can be set immediately before projecting a pattern onto the wafer by the projection aligner 58. Thus, the period of time from the determination of the optimum exposure energy to the exposure is so short that there arise no influence of variations in the process conditions in the period from the photoresist coating to the exposure. Moreover, the path for transferring wafers is short, which has the merits of enhancing the efficiency of the step and suppressing deposition of foreign matter on the wafer during feeding.

Besides, if the optical property measuring system 56 incorporated in the photoresist coating machine 49 is the embodiment above, it is possible to measure the optical property of the photoresist immediately upon baking and after coating. It is therefore possible to control the variations in process conditions for the photoresist coating machine 49 on a real-time basis.

Throughout the drawings, identical reference numerals indicate substantially the same portions.

As has been explained hereinabove, according to the present invention, in a step for forming and treating a light-transmitting thin film on a wafer, the optical property of the wafer before the formation and treatment of the thin film is measured, then the measurement data on the optical property of the formed and treated thin film is corrected to extract only the data on the thin film formed and treated. Based on the measurement results, the variations in the variations in process conditions for the forming and treating apparatus are determined and controlled, whereby stabilization of the forming and treating apparatus can be contrived.

What is claimed is:

1. An exposure system comprising:
   means for measuring a variation with respect to time in an optical property of a photoresist by irradiating a region on a photoresist-coated substrate with a light of a known illuminance having an exposure wavelength;
   means for measuring a thickness of said photoresist;
   means for calculating an optimum exposure energy quantity in accordance with a variation with respect to time in one of a refractive index (n), an absorption coefficient ($\kappa$) and a complex refractive index (N) of the photoresist corresponding to a variation of process conditions obtained by correcting for said variation with respect to time in the optical property of the photoresist measured by the optical property measuring means in relation to a complex index of refraction (n') and reflectivity (R') of an undercoat and the thickness (d) of the photoresist measured by the thickness measuring means;
   means for controlling an exposure energy quantity based on the optimum exposure energy quantity calculated by the optimum exposure energy calculating means; and,
   means for exposing the photoresist-coated substrate in accordance with the exposure energy quantity controlled by the controlling means.

2. The exposure system as set forth in claim 1, wherein the controlling means comprises means for controlling the opening and closing of a shutter in an optical system for illumination.

3. The exposure system as set forth in claim 1, wherein the measuring means includes means for measuring the variation with respect to time in the optical property by measuring at least one of reflectivity, transmittance and polarization property of the photoresist.

4. An exposure system comprising:
   means for measuring a variation in an optical property of a photoresist with respect to time by irradiating a region on a photoresist-coated substrate with a light of a known illuminance having an exposure wavelength and at least one other light having a wavelength different from the exposure wavelength;

means for calculating an optimum exposure energy quantity based on the variation in the optical property of the photoresist measured by the measuring means;

means for controlling an exposure energy quantity based on the optimum exposure energy quantity calculated by the optimum exposure energy calculating means; and, means for exposing the photoresist-coated substrate in accordance with the exposure energy quantity controlled by the controlling means.

5. An exposure system comprising:

means for measuring a variation in an optical property of a photoresist with respect to time by irradiating a region on a photoresist-coated substrate with a light of a known illuminance having an exposure wavelength and for measuring thickness of a photoresist film based on a difference between the optical property of the photoresist before exposure and the optical property of the photoresist after the exposure;

means for calculating an optimum exposure energy quantity based on the variation in the optical property of the photoresist measured by the measuring means;

means for controlling an exposure energy quantity based on the optimum exposure energy quantity calculated by the optimum exposure energy calculating means; and, means for exposing the photoresist-coated substrate in accordance with the exposure energy quantity controlled by the controlling means.

6. The exposure system as set forth in claim 1, wherein said thickness measuring means provides means for measuring the thickness of the photoresist by the optical property of the photoresist.

7. An exposure system comprising:

means for measuring a variation in an optical property of a photoresist with respect to time by irradiating a region on a photoresist-coated first substrate with a light of a known illuminance having an exposure wavelength;

means for calculating at least one of an optimum photoresist coating condition and baking condition based on the variation in the optical property of the photoresist measured by the measuring means;

means for controlling at least one of the coating condition for coating a second substrate with the photoresist and the baking condition for baking the photoresist on the substrate based on the optimum coating or baking condition calculated by the optimum coating or baking condition calculating means; and, means for exposing the second substrate controlled by the controlling means.

8. The exposure system as set forth in claim 7, wherein the controlling means is a photoresist coating machine.

9. The exposure system as set forth in claim 7, wherein the measuring means includes means for measuring the variation in the optical property with respect to time by measuring at least one of the reflectivity, refractive index, transmittance, polarization property and absorption coefficient of the photoresist.

10. The exposure system as set forth in claim 7, wherein the measuring means includes means for measuring the variation in the optical property with respect to time by use of the light having the exposure wavelength and at least one other light having a wavelength different from the exposure wavelength.

11. The exposure system as set forth in claim 7, wherein the measuring means includes means for measuring thickness of a photoresist film based on a difference between the optical property of the photoresist before exposure and the optical property of the photoresist after the exposure.

12. An exposure system comprising:

means for calculating a variation with respect to time in at least one of a refractive index (n), an absorption coefficient ($\kappa$) and a complex refractive index (N) of a photoresist corresponding to a variation of process conditions;

means for calculating an optimum exposure energy quantity so that the variation with respect to time in at least one of the refractive index (n), the absorption coefficient ($\kappa$) and the complex refractive index (N) of the photoresist calculated by said calculating means is obtained;

means for controlling an exposure energy quantity based on the optimum exposure energy quantity calculated by the optimum exposure energy calculating means; and means for exposing a photoresist-coated substrate in accordance with the exposure energy quantity controlled by the controlling means.

13. The exposure system as set forth in claim 12, wherein said variation calculating means provides means for measuring a variation with respect to time in an optical property of a photoresist by irradiating a region on a photoresist-coated substrate with a light of a known illuminance having an exposure wavelength to thereby calculate said variation with respect to time in at least one of the refractive index (n), the absorption coefficient ($\kappa$) and the complex refractive index (N) of the photoresist in accordance with the measured variation with respect to time in the optical property of the photoresist.

14. The exposure system as set forth in claim 13, wherein said variation calculating means further provides means for measuring a thickness of said photoresist to calculate said variation with respect to time in at least one of the refractive index (n), the absorption coefficient ($\kappa$) and the complex refractive index (N) of the photoresist by correcting the variation with respect to time in the optical property of the photoresist with said measured thickness of the photoresist.

15. The exposure system as set forth in claim 13, wherein said variation calculating means further provides means for measuring an optical property of an undercoat by irradiating a region on a substrate not yet coated with photoresist with a light of a known illuminance having an exposure wavelength to calculate said variation with respect to time in at least one of the refractive index (n), the absorption coefficient ($\kappa$) and the complex refractive index (N) of the photoresist by correcting the variation with respect to time in the optical property of the photoresist with said measured optical property of the undercoat.

16. An exposure system comprising:

means for irradiating a region on a substrate not yet coated with a photoresist with light of a known illumination having an exposure wavelength to thereby measure an optical property of an undercoat and for irradiating a region on the substrate coated with the photoresist with light having an exposure wavelength of a known illuminance to thereby measure the variation in the optical property of the photoresist with respect to time;

means for calculating an optimum exposure energy quantity based on the optical property of the undercoat and the variation in the optical property of the photoresist with respect to time measured by the measuring means; and, means for controlling the quantity of exposure energy based on the optimum exposure energy quantity calculated by the optimum exposure energy calculating means, and comprises means for projecting a pattern drawn on a photomask onto the photoresist through control of the quantity of exposure energy by the controlling means.

17. The exposure system as set forth in claim 16, wherein the controlling means comprises means for controlling the opening and closing of a shutter in an optical system for illumination.

18. An exposure system comprising:

means for irradiating a region on a substrate not yet coated with a photoresist with light of a known illumination having an exposure wavelength to thereby measure an optical property of an undercoat and for irradiating a region on the substrate coated with the photoresist with the light having the exposure wavelength of the known illuminance to thereby measure a variation in the optical property of the photoresist with respect to time;

means for calculating an optimum photoresist coating condition based on the optical property of the undercoat and the variation in the optical property of the photoresist with respect to time measured by the measuring means;

means for controlling a condition for coating the substrate with the photoresist based on the optimum coating condition calculated by the optimum coating condition calculating means; and, means for projecting a pattern drawn on a photomask onto the substrate controlled by the controlling means.

19. The exposure system as set forth in claim 18, wherein the measuring means includes means for measuring the variation in the optical property with respect to time by measuring at least one of reflectivity, a refractive index, transmittance, a polarization property and an absorption coefficient of the photoresist.

20. An exposure system comprising:

means for irradiating a region on a substrate not yet coated with a photoresist with light of a known illumination having an exposure wavelength to thereby measure an optical property of an undercoat and for irradiating a region on the substrate coated with the photoresist with the light having the exposure wavelength of the known illuminance to thereby measure a variation in the optical property of the photoresist with respect to time;

means for calculating an optimum photoresist baking condition based on the optical property of the undercoat and the variation in the optical property of the photoresist with respect to time measured by the measuring means;

means for controlling a condition for baking the substrate with the photoresist based on the optimum baking condition calculated by the optimum baking condition calculating means; and means for projecting a pattern drawn on a photomask onto the substrate controlled by the controlling means.

21. The exposure system as set forth in claim 20, wherein the measuring means includes means for measuring the variation in the optical property with respect to time by measuring at least one of the reflectivity, refractive index, transmittance, polarization property and absorption coefficient of the photoresist.

22. A controlling system for treating a thin film comprising:

means for measuring a substrate optical property of a substrate on which a thin film having a light-transmitting property is to be treated;

means for calculating accurately a thin film optical property of the treated thin film based on the substrate optical property measured by the measuring means;

means for controlling a condition of an apparatus for treating a thin film based on the thin film optical property determined by the calculating means; and, means for treating the thin film on the substrate through controlling the condition by the controlling means.

23. An exposure system comprising:

means for measuring a variation with respect to time in a spectral transmittance of a photoresist by irradiating a region on a photoresist-coated substrate with a light of a known illuminance having an exposure wavelength and at least one other light having a wavelength different from the exposure wavelength;

means for calculating an optimum exposure energy quantity based on a variation with respect to time in the spectral transmittance of the photoresist measured by the measuring means;

means for controlling an exposure energy quantity based on the optimum exposure energy quantity calculated by the optimum exposure energy calculating means; and, means for exposing the photoresist-coated substrate in accordance with the exposure energy quantity controlled by the controlling means.

24. An exposure system comprising:

means for measuring an optical property of an undercoat by irradiating a region on a substrate not yet coated with photoresist with a light of a known illuminance having an exposure wavelength;

means for calculating an optimum exposure energy quantity in accordance with the optical property of the undercoat measured by the measuring means;

means for controlling an exposure energy quantity based on the optimum exposure energy quantity calculated by the optimum exposure energy calculating means; and means for exposing a photoresist-coated substrate in accordance with the exposure energy quantity controlled by the controlling means.

25. An exposure system comprising:

means for measuring an optical property of an undercoat by irradiating a region on a substrate not yet coated with a photoresist with a light of a known illuminance having an exposure wavelength and for measuring a thickness of said photoresist;

means for calculating an optimum exposure energy quantity in accordance with the optical property of the undercoat measured and the thickness of said photoresist by the measuring means;

means for controlling an exposure energy quantity based on the optimum exposure energy quantity calculated by the optimum exposure energy calculating means; and, means for exposing a photoresist-coated substrate in accordance with the exposure energy quantity controlled by the controlling means.

26. An exposure system comprising:

means for measuring a variation with respect to time in an optical property of a photoresist by irradiating a region on a photoresist-coated substrate with a light of a known illuminance having an exposure wavelength;

means for measuring a thickness of said photoresist;

means for calculating an optimum exposure energy quantity in accordance with said variation with respect to time in the optical property of the photoresist measured by the optical property measuring means and the thickness of the photoresist measured by the thickness measuring means;

means for controlling an exposure energy quantity based on the optimum exposure energy quantity calculated by the optimum exposure energy calculating means; and means for exposing the photoresist-coated substrate in accordance with the exposure energy quantity controlled by the controlling means.

* * * * *